(12) United States Patent
Dover et al.

(10) Patent No.: US 7,199,614 B2
(45) Date of Patent: Apr. 3, 2007

(54) OVER-VOLTAGE TOLERANT BUS HOLD CIRCUIT AND METHOD THEREFOR

(75) Inventors: Frank Dover, Mesa, AZ (US); Senpeng Sheng, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 173 days.

(21) Appl. No.: 11/012,109

(22) Filed: Dec. 16, 2004

(65) Prior Publication Data

US 2006/0132173 A1   Jun. 22, 2006

(51) Int. Cl.
*H03K 19/0175* (2006.01)

(52) U.S. Cl. .............................. 326/81; 326/80; 326/86

(58) Field of Classification Search ............ 326/80–83, 326/86, 90; 327/331–333
See application file for complete search history.

(56) References Cited

U.S. PATENT DOCUMENTS 6,774,675 B1 * 8/2004 Miske et al. .................. 326/81
7,064,593 B2 * 6/2006 Hinterscher et al. ......... 327/198

* cited by examiner

*Primary Examiner*—Anh Q. Tran
(74) *Attorney, Agent, or Firm*—Robert F. Hightower

(57) ABSTRACT

In one embodiment a bus hold circuit decouples an inverter of the bus hold circuit from an operating voltage responsively to an input receiving a signal having a voltage that is approximately equal to or greater than the value of the operating voltage.

17 Claims, 2 Drawing Sheets

OVER-VOLTAGE TOLERANT BUS HOLD CIRCUIT AND METHOD THEREFOR

BACKGROUND OF THE INVENTION

The present invention relates, in general, to electronics, and more particularly, to methods of forming semiconductor devices and structure.

In the past, the semiconductor industry utilized various structures and methods for producing bus hold circuits. Bus hold circuits generally were used in applications where multiple circuits were connected to a single bus that provided signal interconnect between the multiple circuits. In some cases, the driver circuits that drove the bus entered a tri-state mode which allowed the bus to float. The bus hold circuits maintained the bus at the level of the last signal that was applied to the bus. FIG. 1 illustrates a schematic of a prior bus hold circuit 100. Bus hold circuit 100 included a first inverter 103 and a second inverter 104 connected in a back-to-back latch configuration so that the output of inverter 103 was connected to the input of inverter 104 and the output of inverter 104 was connected to the input of inverter 103. Consequently, when an external signal was applied to an input 101, an output 102 was forced low and the state was latched by inverter 104. Inverter 103 operated directly from a source of operating power that was applied to a power supply input 106 of circuit 100. A diode connected transistor 105 typically was used to connect a power input terminal 107 of inverter 104 to power supply input 106. When the external signal applied to input 101 was removed, circuit 100 typically could only pull input 101 to a value that was approximately equal to the value of the operating voltage minus the threshold voltage of transistor 105. In some cases, the lowered output voltage value was too low to be recognized as a logic high thereby causing inaccurate system operation.

In some embodiments, a Schottky diode replaced transistor 105 in order to lower the forward voltage drop. The Schottky diode operated the same as diode connected transistor 105 but at the lower voltage drop and had the same disadvantages including the lowered output voltage value. Process to implement Schottky diodes typically were most costly than other processes thereby increasing the cost of the devices using the Schottky diodes.

Accordingly, it is desirable to have a bus hold circuit that does not lower the maximum value of the output voltage of the bus hold circuit, that facilitates the input voltage having a value that is greater than the operating voltage of the device, and that protects the circuit from input voltage values that are no less than the operating voltage.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention.

DETAILED DESCRIPTION OF THE DRAWINGS

Figure 2:
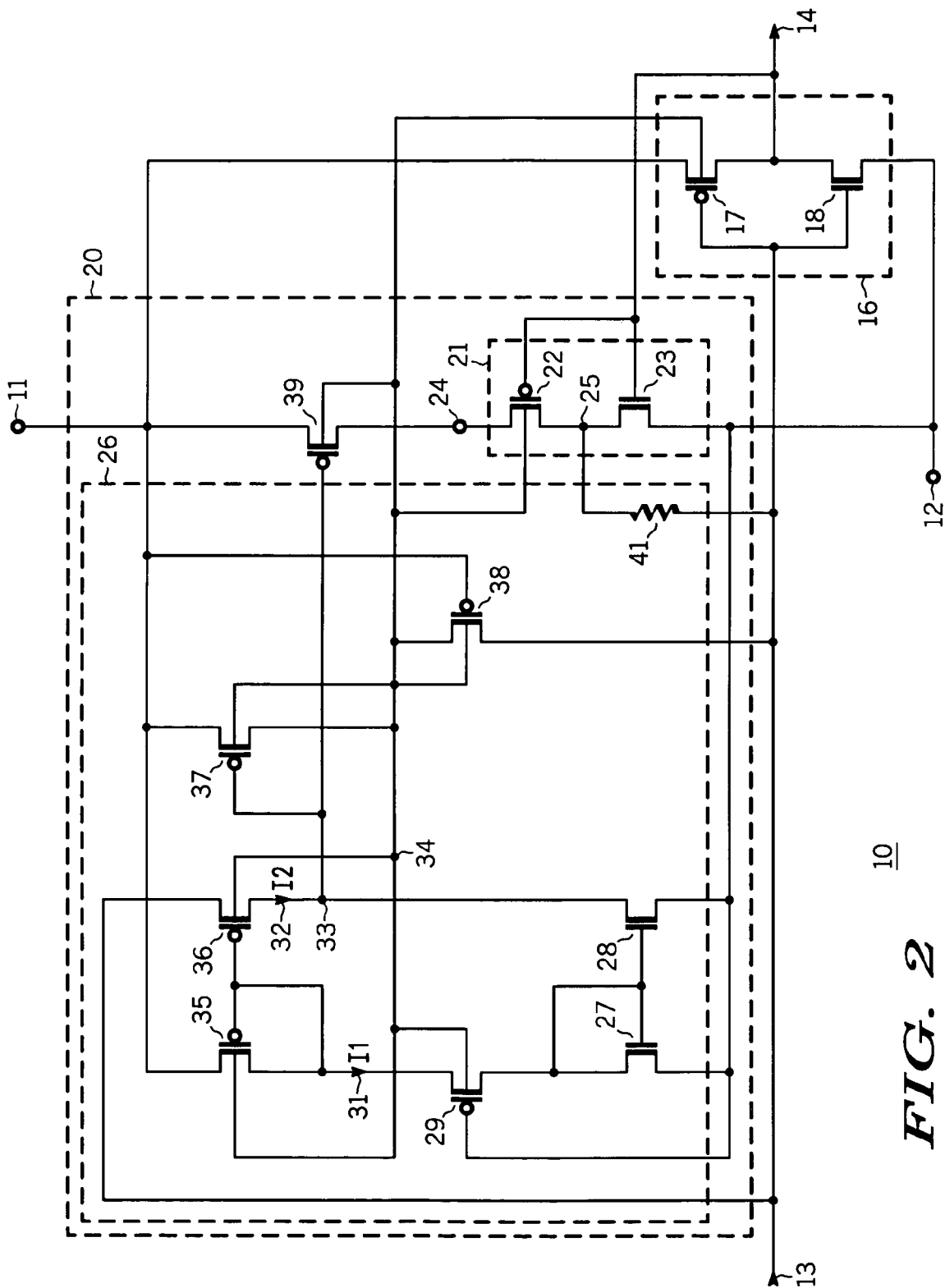
FIG. 2 schematically illustrates an embodiment of a portion of a bus hold circuit in accordance with the present invention.

FIG. 2 schematically illustrates an embodiment of a portion of a bus hold circuit 10 that provides over-voltage tolerant operation for input signals that have a voltage that is approximately equal to or greater than the value of the operating voltage of circuit 10. Circuit 10 receives the operating voltage between an operating voltage input terminal 11 and a voltage return 12. Circuit 10 receives an input signal on a signal input 13 and provides an output signal on an output 14. Circuit 10 includes a receiving inverter 16 and a latch inverter 21 that are connected in a back-to-back configuration to form a latch. An output 25 of inverter 21 is connected to an input of inverter 16 and to input 13 through a resistor 41, and an output of inverter 16 is connected to an input of inverter 21 and to output 14. Inverter 16 contains a lower transistor 18 and an upper transistor 17 that preferably are metal-oxide semiconductor (MOS) transistors. Inverter 21 includes a lower transistor 23 and an upper transistor 22 that also preferably are MOS transistors. Circuit 10 also includes a protection switch 39 and a control circuit 26. Control circuit 26 receives the value of the input signal applied to input 13 and controls switch 39 to couple operating voltage input 24 of inverter 21 to terminal 11 so that inverter 21 can receive the operating voltage when the value of the input signal on input 13 is approximately less than the value of the operating voltage. Control circuit 26 also decouples input 24 from terminal 11 so that inverter 21 is decoupled from the operating voltage when the value of the input signal is approximately greater than or equal to the value of the operating voltage on input 11. In the preferred embodiment, switch 39 is a P-channel MOS transistor. Control circuit 26, switch 39, and inverter 21 function as a high voltage latching inverter 20 of circuit 10.

Control circuit 26 includes transistors 27 and 28 that are connected in a current mirror configuration with transistors 35 and 36 that are also connected in a current mirror configuration, a switch transistor 29, and high voltage protection transistors 37 and 38 that are configured to couple the body of transistors 17, 22, 29, 35, 36, 37, 38, and the preferred embodiment of transistor 39 to the highest voltage that is applied to circuit 10 in order to prevent latch-up of the transistors of circuit 10. Preferably, transistors 18, 23, 27, and 28 are N-channel MOS transistors and transistors 17, 22, 29, 35, 36, 37, 38, and 39 are P-channel MOS transistors.

For clarity of the explanation, the operation of the preferred embodiment is explained, however, other embodiments should provide similar operation with the same coupling and decoupling of inverter 21 to terminal 11. In operation of the preferred embodiment, when the value of the input signal applied to input 13 is less than the value of the operating voltage applied to terminal 11, the source of transistor 36 receives the value of the input signal and the source of transistor 35 receives the operating voltage. Since the operating voltage is greater than the value of the input signal, the gate-to-source voltage (Vgs) of transistor 36 is less than the Vgs of transistor 35 and transistor 36 generates a current I2, illustrated by an arrow 32, that is less than the value of a current I1, illustrated by an arrow 31, generated by transistor 35. Since I2 is less than I1, transistor 27 couples a Vgs to transistor 28 that enables transistor 28 to conduct more current than is provided by current I2. Thus, transistor 28 pulls a node 33 toward a low voltage of the voltage on return 12. The low on node 33 enables transistor 39 to couple inverter 21 to receive the operating voltage on terminal 11. The low voltage on node 33 also enables transistor 37 to connect the operating voltage on terminal 11 to charge the body regions of each of transistors 17, 22, 29, 35, 36, 37, 38, and 39. Connecting the body regions to the operating voltage ensures that the body regions are connected to the highest potential applied to circuit 10 during these operating conditions. If the input signal is a low, inverter 16 forces output 14 high, inverter 21 receives the high and forces output 25 low to latch the low at input 13. If input 13 is a logic high having a value that is less than the value of the operating voltage, inverter 16 forces output 14 low, inverter 21 receives the low and forces output 25 high to latch the low at input 13. Since the current flow through resistor 41 is very low, the high from inverter 21 drives input 13 to a value approximately equal to the value of operating voltage.

When the value of the input signal applied on input 13 becomes approximately equal to or greater than the value of the operating voltage on terminal 11, the Vgs of transistor 36 becomes larger than the Vgs of transistor 35 and current I2 becomes greater than I1. Transistor 28 is formed to have a current carrying capability that is less than the current carrying capability of transistors 27, 35, and 36, thus, transistor 28 cannot support the current of I2 and the voltage drop across transistor 28 increases allowing transistor 36 to pull node 33 to a value that is close to the value of the input signal on input 13. Resistor connected transistor 29 is also formed to have a current carrying capability that is less than the current carrying capability of transistors 27. Pulling node 33 high disables transistor 37. Since the source of transistor 38 is connected to input 13, transistor 38 is enabled and couples the body region or body of transistors 17, 22, 29, 35, 36, 37, 38, and 39 to the input signal which has become the highest voltage applied to circuit 10. Pulling node 33 high also disables transistor 39 thereby decoupling inverter 21 from the operating voltage applied to input 11 and disabling inverter 21. The high voltage value of the input signal is received by inverter 16 which forces output 14 low. The low from output 14 is applied to transistor 23 which has no effect since transistor 23 is disabled. Resistor 41 provides current limiting to prevent the-high voltage of the input signal from damaging circuit 10. Disabling transistor 39 prevents the high voltage on input 13 from damaging circuit 10 and also prevents leakage current from flowing from terminal 11 to input 13 thereby further protecting circuit 10 and reducing the power dissipation. It will be noted that some current flows through the current mirror of transistors 27, 28, 35, and 36 although the value of the current is small.

Decoupling inverter 21 from the operating voltage when the value of the input signal is greater than the value of the operating voltage also allows circuit 10 to be used as a translator circuit. For example, the value of the voltage on a bus may be higher than the operating voltage used within the functional block that is connected to the bus. For example the value of the signals on the bus applied to input 13 may be approximately 3.0 volts while the value of the operating voltage on terminal 11 may be about 1.6 volts. A high input signal applied to input 13 forces output 14 low as described previously. A low input signal applied to input 13 forces output 14 high at value determined by the value of the operating voltage on terminal 11. Thus, circuit 10 may also function as a translator.

To implement this functionality of the preferred embodiment, input 13 is connected to a source of transistor 36 which has a gate commonly connected to a gate and a drain of transistor 35 and to a drain of transistor 29. A drain of transistor 36 is commonly connected to a drain of transistor 28 and a gate of transistors 37 and 39. A source of transistor 28 is connected to return 12 and to a source of transistor 27. A gate of transistor 27 is commonly connected to a gate of transistor 28, a drain of transistor 27, and a source of transistor 29. A gate of transistor 29 is connected to return 12. A source of transistor 37 is commonly connected to terminal 11, a source of transistor 35, a gate of transistor 38, a drain of transistor 17, and a source of transistor 39. A drain of transistor 37 is commonly connected to a source of transistor 38 and the body region of transistors 17, 22, 29, 35, 36, 37, 38, and 39. A drain of transistor 38 is connected to input 13, to a gate of transistors 17 and 18, and to a first terminal of resistor 41. A second terminal of resistor 41 is connected to output 25 of inverter 21 and a drain of transistors 22 and 23. The source of transistor 22 is connected to input 24 and to a drain of transistor 39. A gate of transistor 22 is commonly connected to a gate of transistor 23, output 14, and the drain of transistors 17 and 18. A source of transistors 18 and 23 is connected to return 12.

Figure 1:
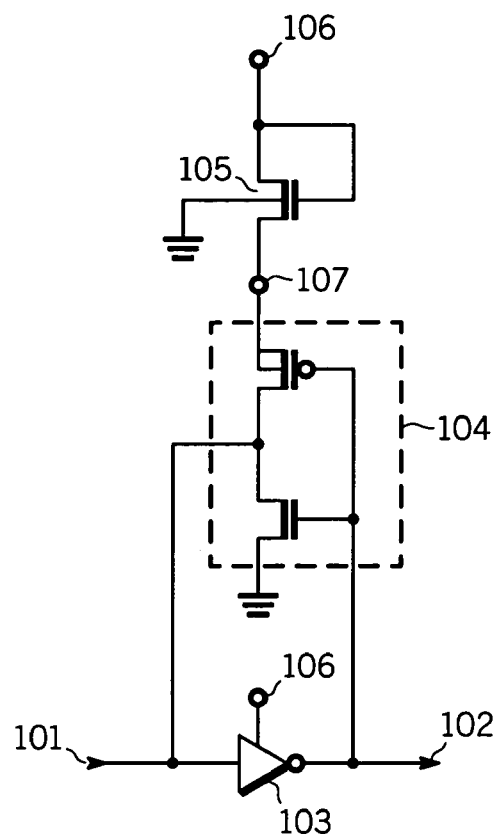
FIG. 1 schematically illustrates an embodiment of a prior art bus hold circuit.
Figure 3:
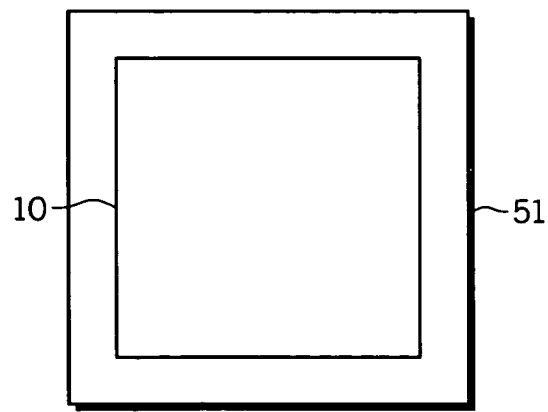
FIG. 3 illustrates a plan view of an embodiment of a portion of a semiconductor device that includes the bus hold circuit of FIG. 2 in accordance with the present invention.

FIG. 3 schematically illustrates an enlarged plan view of a portion of an embodiment of a semiconductor device 50 that is formed on a semiconductor die 51. Circuit 10 is formed on die 51. Die 51 may also include other circuits that are not shown in FIG. 3 for simplicity of the drawing. Circuit 10 and device 50 are formed on die 51 by semiconductor manufacturing techniques that are well known to those skilled in the art.

In view of all of the above, it is evident that a novel device and method is disclosed. Included, among other features, is forming a bus hold circuit to selectively couple operating power to a latch inverter when the value of the input signal is less than the operating voltage and to decouple operating power from the latch inverter when the value of the input signal is no less than the operating voltage. Additionally, ensuring that the well of P-channel transistors is charged to the most positive voltage applied to the circuit provides additional latch-up protection. Forming all of the active elements of the bus hold circuit as CMOS transistors lowers the costs of the bus hold circuit.

While the invention is described with specific preferred embodiments, it is evident that many alternatives and variations will be apparent to those skilled in the semiconductor arts. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming an over-voltage bus hold circuit comprising:

coupling a first inverter and a second inverter as a latch;

configuring a switch to operably couple an operating voltage to the second inverter responsively to a signal input of the first inverter receiving an input signal that is approximately less than a value of the operating voltage;

coupling a pair of transistors in a current mirror configuration to receive the input signal and responsively form a current having a first value that is representative of the input signal having a value that is no less than the value of the operating voltage and to have a second value that is representative of the input signal having a value that is less than the value of the operating voltage; and configuring the switch to operably decouple the operating voltage from the second inverter responsively to the first value of the current.

2. The method of claim 1 wherein configuring the switch to operably couple the operating voltage to the second inverter includes coupling the switch in series between an operating voltage input of the second inverter and the operating voltage.

3. The method of claim 1 wherein configuring the switch to operably decouple the operating voltage from the second inverter includes coupling a control input of the switch to receive a control signal that is representative of the input signal.

4. The method of claim 3 wherein coupling the control input of the switch to receive the control signal that is representative of the input signal includes coupling a first current carrying electrode of a first current mirror transistor of the pair of transistors in the current mirror configuration to receive the input signal and responsively form the control signal.

5. The method of claim 4 further including coupling a second current carrying electrode of the first current mirror transistor of the pair of transistors in the current mirror configuration to the control input of the switch.

6. The method of claim 1 wherein configuring the switch to operably decouple the operating voltage from the second inverter includes coupling a first P-channel MOS transistor in series between an operating voltage input of the second inverter and the operating voltage.

7. The method of claim 6 further including configuring a second P-channel MOS transistor to couple a body of the first P-channel MOS transistor to the operating voltage responsively to the first inverter receiving the input signal that is approximately less than the value of the operating voltage.

8. The method of claim 6 further including configuring a second P-channel MOS transistor to couple a body of the first P-channel MOS transistor to the operating voltage responsively to the first inverter receiving the input signal that is no less than the value of the operating voltage.

9. A method of operating a bus hold circuit comprising:
receiving an input signal having a voltage value that is approximately no less than an operating voltage of the bus hold circuit;
coupling the input signal to an output of a first inverter;
using a pair of current mirror coupled transistors to form a current having a first value that is representative of the input signal having the voltage value that is approximately no less than the operating voltage and having a second value that is representative of the input signal having a voltage value that is approximately less than the operating voltage; and
selectively disabling a switch to decouple the first inverter from the operating voltage.

10. The method of claim 9 further including receiving the input signal having the voltage value that is approximately less than the operating voltage of the bus hold circuit and responsively enabling the switch to couple the first inverter to the operating voltage.

11. The method of claim 9 wherein disabling the switch to decouple the first inverter from the operating voltage includes disabling a transistor to decouple the first inverter from the operating voltage and coupling a body of the transistor to receive the input signal.

12. The method of claim 9 wherein disabling the switch to decouple the first inverter from the operating voltage includes coupling a body of a first transistor of the first inverter to receive the input signal.

13. An over-voltage bus hold circuit comprising:
a first inverter having an signal input, a signal output, and an operating voltage input;
a switch operably coupled between the operating voltage input of the first inverter and an operating voltage terminal that is configured for receiving an operating voltage, the switch having a control input; and
a control circuit configured to enable the switch responsively to the signal output receiving a signal having a value that is approximately no less than the operating voltage, the control circuit including a first transistor configured to couple a body of the switch to the signal having the value that is approximately no less than the operating voltage responsively to the signal output receiving the signal having the value that is no less than the operating voltage, the first transistor having a first current carrying electrode coupled to the body of the switch, a body coupled to the body of the switch, a second current carrying electrode coupled to the signal output of the first inverter, a second transistor having a first current carrying electrode coupled to the body of the switch, a body coupled to the body of the switch, a second current carrying electrode coupled to receive the operating voltage, and a control electrode coupled to a control input of the switch.

14. The over-voltage bus hold circuit of claim 13 further including the control circuit configured to disable the switch responsively to the signal output receiving a signal having a value that is approximately less than the operating voltage.

15. The over-voltage bus hold circuit of claim 13 wherein the first inverter includes a first transistor having a body contact and also having a first current carrying electrode coupled to the operating voltage input.

16. The over-voltage bus hold circuit of claim 13 wherein the control circuit includes a current mirror having a third transistor, the third transistor having a first current carrying electrode coupled to receive the signal output of the first inverter, a second current carrying electrode coupled to the control input of the switch, a body coupled to the body of the switch, and a control electrode coupled to a control electrode of a fourth transistor that is a portion of the current mirror.

17. The over-voltage bus hold circuit of claim 16 wherein the current mirror includes a fifth transistor having a first current carrying electrode coupled to the second current carrying electrode of the third transistor, a control electrode, and a second current carrying electrode coupled to a voltage return, a sixth transistor having a control electrode coupled to the control electrode of the fifth transistor, a first current carrying electrode coupled to the voltage return, and a second current carrying electrode coupled to the control electrode, and a seventh transistor having a body coupled to the body of the switch, a control electrode coupled to the signal output of the first inverter, a first current carrying electrode coupled to the second current carrying electrode of the sixth transistor, and a second current carrying electrode coupled to a first current carrying electrode of the fourth transistor, and the fourth transistor having a body coupled to the body of the switch, and a second current carrying electrode coupled to receive the operating voltage.

* * * * *